(12) United States Patent
Su et al.

(10) Patent No.: US 10,439,163 B2
(45) Date of Patent: Oct. 8, 2019

(54) OLED DISPLAY PANEL AND MANUFACTURE METHOD THEREOF, DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Tongshang Su, Beijing (CN); Guangcai Yuan, Beijing (CN); Dongfang Wang, Beijing (CN); Bin Zhou, Beijing (CN); Ce Zhao, Beijing (CN); Jun Liu, Beijing (CN); Ning Liu, Beijing (CN); Kai Xu, Beijing (CN); Shengping Du, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/768,972

(22) PCT Filed: Oct. 13, 2017

(86) PCT No.: PCT/CN2017/106091
§ 371 (c)(1),
(2) Date: Apr. 17, 2018

(87) PCT Pub. No.: WO2018/149158
PCT Pub. Date: Aug. 23, 2018

(65) Prior Publication Data
US 2018/0331320 A1 Nov. 15, 2018

(30) Foreign Application Priority Data
Feb. 20, 2017 (CN) .......................... 2017 1 0090227

(51) Int. Cl.
*H01L 51/52* (2006.01)
*H01L 27/32* (2006.01)
(Continued)

(52) U.S. Cl.
CPC .......... *H01L 51/5246* (2013.01); *H01L 21/77* (2013.01); *H01L 23/3114* (2013.01);
(Continued)

(58) Field of Classification Search
CPC ............... H01L 51/5246; H01L 27/322; H01L 51/5253; H01L 51/5259
(Continued)

(56) References Cited

U.S. PATENT DOCUMENTS 6,833,668 B1 * 12/2004 Yamada et al. ....... H01L 51/525
313/505
7,538,488 B2 * 5/2009 Kwak .................. H01L 27/3276
313/506
(Continued)

FOREIGN PATENT DOCUMENTS

| CN | 1658713 A | 8/2005 |
|---|---|---|
| CN | 1700826 A | 11/2005 |

(Continued)

OTHER PUBLICATIONS

International Search Report dated Jan. 3, 2018; PCT/CN2017/106091.
(Continued)

*Primary Examiner* — Thinh T Nguyen

(57) ABSTRACT

An organic light emitting diode (OLED) display panel and a manufacture method thereof, a display device are disclosed. The method includes providing a base substrate, including a display area and a package area; forming a driving transistor, a passivation layer and an OLED display unit on the base substrate, wherein the OLED display unit
(Continued)

and the driving transistor are formed in the display area, the passivation layer is formed in both the display area and the package area and includes a plurality of recesses in the package area and a via hole in the display area, and the via hole and the plurality of recesses are formed by same one patterning process; coating a sealant in the package area to cover the plurality of recesses; and providing a package substrate, the package substrate and the base substrate being assembled together and sealed oppositely by the sealant.

14 Claims, 7 Drawing Sheets

(51) Int. Cl.
    *H01L 51/56* (2006.01)
    *H01L 21/77* (2017.01)
    *H01L 23/31* (2006.01)
    *G09G 3/3225* (2016.01)

(52) U.S. Cl.
    CPC ........ *H01L 27/322* (2013.01); *H01L 27/3246* (2013.01); *H01L 27/3258* (2013.01); *H01L 51/5206* (2013.01); *H01L 51/5221* (2013.01); *H01L 51/5253* (2013.01); *H01L 51/56* (2013.01); *G09G 3/3225* (2013.01); *H01L 51/5259* (2013.01)

(58) Field of Classification Search
    USPC ............. 257/40, 59, 72; 438/82, 99, 48, 128
    See application file for complete search history.

(56) References Cited

U.S. PATENT DOCUMENTS

| | | |
|---|---|---|
| 2005/0184927 A1 | 8/2005 | Kwak |
| 2005/0263775 A1 | 12/2005 | Ikeda et al. |
| 2014/0291629 A1 | 10/2014 | Kim et al. |
| 2015/0084498 A1 | 3/2015 | Choi |
| 2015/0236927 A1* | 8/2015 | Hong et al. ......... H01L 51/5237 257/40 |
| 2018/0006268 A1 | 1/2018 | Hong et al. |
| 2018/0069193 A1 | 3/2018 | Hong et al. |
| 2018/0076416 A1 | 3/2018 | Cho et al. |

FOREIGN PATENT DOCUMENTS

| | | |
|---|---|---|
| CN | 104253241 A | 12/2014 |
| CN | 104851902 A | 8/2015 |
| CN | 106057848 A | 10/2016 |
| CN | 106876328 A | 6/2017 |
| WO | 2016/002746 A1 | 1/2016 |

OTHER PUBLICATIONS

The First Chinese Office Action dated Feb. 26, 2019; Appln. No. 201710090227.3.

\* cited by examiner

OLED DISPLAY PANEL AND MANUFACTURE METHOD THEREOF, DISPLAY DEVICE

The present application claims priority to Chinese patent application No. 201710090227.3, filed on Feb. 20, 2017, the entire disclosure of which is incorporated herein by reference as part of the present application.

TECHNICAL FIELD

The present disclosure relates to an organic light-emitting diode (OLED) display panel and a manufacture method thereof, a display device.

BACKGROUND

Organic light emitting diodes (OLEDs) are organic thin-film electroluminescent devices which have the advantages such as simple preparation process, low cost, low power consumption, high brightness, wide viewing angle, high contrast and ability of achieving flexible display, and have attracted great attention of people. As a new generation of display means, The OLED display technology has begun to gradually replace the traditional liquid crystal display technology, and is widely used in mobile phones, computers, full-color TVs, digital video cameras, personal digital assistants and other electronic devices. The OLED display technology is different from the traditional liquid crystal display technology, and an OLED device of an OLED display panel comprises an anode, a cathode and a light emitting layer that is interposed between the anode and cathode. Where a voltage is applied across the anode and the cathode, holes and electrons move to the light emitting layer, and holes and electrons recombine in the light emitting layer to emit light. However, the cathode in the OLED display panel is an active metal that is very sensitive to water vapor and oxygen in the air and is very easy to react with moisture and oxygen penetrated from the outside environment and affect charge injection. In addition, the water vapor and the oxygen that penetrate into the OLED device can also chemically react with the organic light emitting material in the light emitting layer to damage the organic light emitting material and greatly lower the light emitting efficiency of the organic light emitting material. As a result, the performance of the OLED display panel is degraded and its lifetime is shortened. Therefore, requirements on an OLED display panel in package are very high.

SUMMARY

At least one embodiment of the present disclosure provides an organic light emitting diode (OLED) display panel, a manufacture method of an OLED display panel, and a display device.

At least one embodiment of the present disclosure provides a manufacture method of an organic light emitting diode (OLED) display panel, comprising: providing a base substrate, the base substrate comprising a display area and a package area that is located at a periphery of the display area; forming a driving transistor, a passivation layer and an OLED display unit on the base substrate, wherein the OLED display unit and the driving transistor are formed in the display area, the passivation layer is formed in both the display area and the package area, the passivation layer comprises a plurality of recesses that are formed in the package area and a via hole that is formed in the display area to expose a source electrode or a drain electrode of the driving transistor, and the via hole and the plurality of recesses are formed by same one patterning process; coating a sealant in the package area, wherein the sealant covers the plurality of recesses; and providing a package substrate, wherein the package substrate and the base substrate are assembled together and sealed oppositely by the sealant.

For example, the manufacture method of an OLED display panel provided by at least one embodiment of the present disclosure further comprises: forming a package layer on the OLED display unit; and forming a filling layer on the package layer; the package substrate is arranged on the sealant and the filling layer to allow the package substrate and the base substrate to be assembled together and sealed oppositely.

For example, in the manufacture method of an OLED display panel provided by at least one embodiment of the present disclosure, a material of the filling layer comprises a desiccant.

For example, in the manufacture method of an OLED display panel provided by at least one embodiment of the present disclosure, a longitudinal cross-sectional shape of each of the recesses is a rectangular or a trapezoidal.

For example, in the manufacture method of an OLED display panel provided by at least one embodiment of the present disclosure, the recesses are through holes that penetrate the passivation layer.

For example, the manufacture method of an OLED display panel provided by at least one embodiment of the present disclosure further comprises: forming a gate insulating layer in both the display area and the package area during forming the driving transistor, and at least partially etching the gate insulating layer, with the through holes exposing the gate insulating layer, during forming the through holes in the passivation layer.

For example, in the manufacture method of an OLED display panel provided by at least one embodiment of the present disclosure, an anode or a cathode of the OLED display unit is electrically connected with the source electrode or the drain electrode of the driving transistor through the via hole during forming the OLED display unit.

At least one embodiment of the present disclosure provides an organic light emitting diode (OLED) display panel, comprising: a base substrate, comprising a display area and a package area that is located at a periphery of the display area; a driving transistor, a passivation layer and an OLED display unit that are arranged on the base substrate, wherein the OLED display unit and the driving transistor are arranged in the display area, the passivation layer is arranged in both the display area and the package area, the passivation layer comprises a plurality of first recesses in the package area and a via hole in the display area that exposes a source electrode or a drain electrode of the driving transistor, the plurality of first recesses and the via hole are formed by same one patterning process and the OLED display unit is electrically connected with the driving transistor through the via hole; a sealant that is arranged in the package area and covers the plurality of first recesses; and a package substrate that is assembled and sealed oppositely with the base substrate.

For example, the OLED display panel provided by at least one embodiment of the present disclosure further comprises: a package layer that is arranged on the OLED display unit; and a filling layer that is arranged on the package layer; the package substrate is arranged on the sealant and the filling layer, and the package substrate and the base substrate are assembled together and sealed oppositely.

For example, in the OLED display panel provided by at least one embodiment of the present disclosure, a material of the filling layer comprises a desiccant.

For example, in the OLED display panel provided by at least one embodiment of the present disclosure, a longitudinal cross-sectional shape of each of the recesses is a rectangular or a trapezoidal.

For example, in the OLED display panel provided by at least one embodiment of the present disclosure, the recesses are through holes that penetrate the passivation layer.

For example, in the OLED display panel provided by at least one embodiment of the present disclosure, a gate insulating layer of the driving transistor also extends to the package area and is exposed by the through holes, and the gate insulating layer further comprises second recesses corresponding to the through holes.

For example, in the OLED display panel provided by at least one embodiment of the present disclosure, an anode or a cathode of the OLED display unit is electrically connected with the source electrode or the drain electrode of the driving transistor through the via hole.

At least one embodiment of the present disclosure provides a display device, comprising the OLED display panel according to any one of the above mentioned OLED display panels.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

Figure 1:
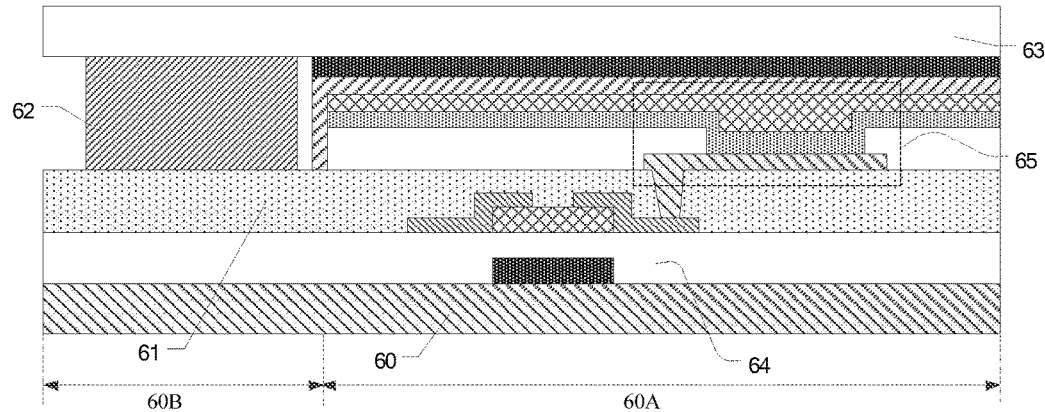
FIG. 1 is a partial sectional schematic diagram of an organic light emitting diode (OLED) display panel.

REFERENCE NUMERALS 60, 10—base substrate; 61, 17—passivation layer; 62, 32—sealant; 63, 33—package substrate; 65, 1—OLED display unit; 60A, 10A—display area; 60B, 10B—package area; 64, 2—driving transistor; 3—switch transistor; 11—gate electrode; 12—active layer; 13—third electrode; 14—fourth electrode; 15—gate insulating layer; 16—via hole; 18—photoresist; 180—photoresist pattern; 19—mask; 19a—first pattern; 19b—second pattern; 20—first electrode; 21—pixel definition layer; 22—organic layer; 23—second electrode; 30—package layer; 31—filling layer; 35—first recess; 36—second recess; 325—through hole; 40—planarization layer; 41—color filter film.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The sizes of respective patterns in the OLED display panel related to the embodiments of the present disclosure are usually in micron level or smaller level in actual products, and for the sake of clarity, the size of each structure in the drawings of the embodiment of the present disclosure is amplified and does not represent the actual size and scale unless expressly stated otherwise.

Components, such as a light emitting layer, a metal cathode and so on, in an organic light emitting diode (OLED) display panel are very sensitive to water vapor, oxygen and so on in the air, and are prone to react with water, oxygen and so on that penetrate into the OLED display panel from outside, thus affecting the performance of OLED display panel and shortening the service time of the OLED display panel. Therefore, it is necessary to package the OLED display panel to improve the protection to the internal components in the OLED display panel.

At present, commonly used packaging technologies comprise ultraviolet (UV) curing adhesive, laser sealing, face sealing, desiccant packaging, dam & fill packing, thin film packaging, and so on. UV curing adhesive, sealing agent, desiccant, dam & fill packing employ organic sealant, and some new packaging technologies also be applied in combination with organic sealant, so the packaging performance of organic sealant is very important. Adhesiveness between organic sealant and the surface of a passivation layer is an important factor in determining the packaging effect. In the packaging method of a conventional OLED display panel, the contact area of organic sealant and a passivation layer is small, resulting in a poor OLED display panel packaging effect. Water vapor and oxygen in the external environment are easy to permeate through a gap into the internal package area of the OLED display panel, and react with the internal components of the OLED display panel, bringing about rapid degradation of the performance of the OLED display panel and shortened service life.

FIG. 1 illustrates a partial sectional schematic diagram of an organic light emitting diode (OLED) display panel. As illustrated in FIG. 1, the OLED display panel comprises a base substrate 60. The base substrate 60 comprises a display area 60A and a package area 60B. A driving transistor 64, a passivation layer 61 and an OLED display unit 65 are arranged in the display area 60A. The passivation layer 61 further extends into the package area 60B. Sealant 62 is coated directly on the portion of the passivation layer 61 that extends into the package area 60B, and then the sealant 62 is cured by irradiation with ultraviolet light to realize the packaging of the OLED display panel. In this situation, the contact area of the sealant 62 and the passivation layer 61 is small, and the adhesiveness between the sealant 62 and the passivation layer 61 is poor, generating a gap in the interface between the sealant 62 and the passivation layer 61 easily. External water vapor, oxygen and so on can move inside the OLED display panel through the gap, and thus react with components such as a light emitting layer, a metal cathode and so on inside the OLED display panel, resulting in rapid degradation of performance of the OLED display panel and shortening the service life of the display panel.

At least one embodiment of the present disclosure provides a manufacture method of an organic light emitting diode (OLED) display panel, an OLED display panel and a display device to improve the packaging performance of the OLED display panel.

A manufacture method of an OLED display panel provided by an embodiment of the present disclosure comprises: providing a base substrate; forming a driving transistor, a passivation layer and an OLED display unit on the base substrate, wherein the base substrate comprises a display area and a package area that is located at a periphery of the display area: the OLED display unit and the driving transistor are formed in the display area, the passivation layer is formed in both the display area and the package area, the passivation layer comprises a plurality of recesses that are formed in the package area and a via hole that is formed in the display area to expose a source electrode or a drain electrode of the driving transistor, and the via hole and the plurality of recesses are formed by same one patterning process; coating a sealant in the package area, wherein the sealant covers the plurality of recesses; and providing a package substrate, wherein the package substrate and the base substrate are assembled together and sealed oppositely by the sealant.

The manufacture method of an OLED display panel provided by the embodiment of the present disclosure can form the via hole and the plurality of recesses on the passivation layer by the same patterning process, which can reduce the number of used masks, shorten the production time of the OLED display panel, and reduce the production costs of the OLED display panel; on the other hand, the plurality of recesses can increase the contact area between the sealant and the passivation layer, thus increase the adhesiveness between the sealant and the interface of the passivation layer, improve the packaging effect of the OLED display panel, and reduce the oxygen and water vapor that penetrate into the OLED display panel, improve the display performance and stability of the OLED display panel, prolong the service life of the OLED display panel, and improve product yield.

In the embodiments of the present disclosure, the patterning process is, for example, a photolithographic patterning process. For example, the patterning process comprises coating a photoresist film on a structure layer that needs to be patterned, and coating of the photoresist film can adopt a method of spin coating, blade coating or roll coating; the photoresist layer is then exposed using a mask, the exposed photoresist layer is developed to obtain a photoresist pattern; then the structure layer is etched by using the photoresist pattern, the photoresist pattern is removed optionally; the remaining photoresist is finally stripped off to form the desired pattern structure.

In the embodiment of the present disclosure, same one patterning process means forming a layer structure using the same mask. According to a different specific pattern, a patterning process may comprise a plurality of exposure, development, or etching processes. The specific pattern(s) in the formed layer structure can be continuous or discontinuous (separate) and the specific patterns can also be at a different height or have a different thicknesses.

The following presents several examples.

Figure 2A:
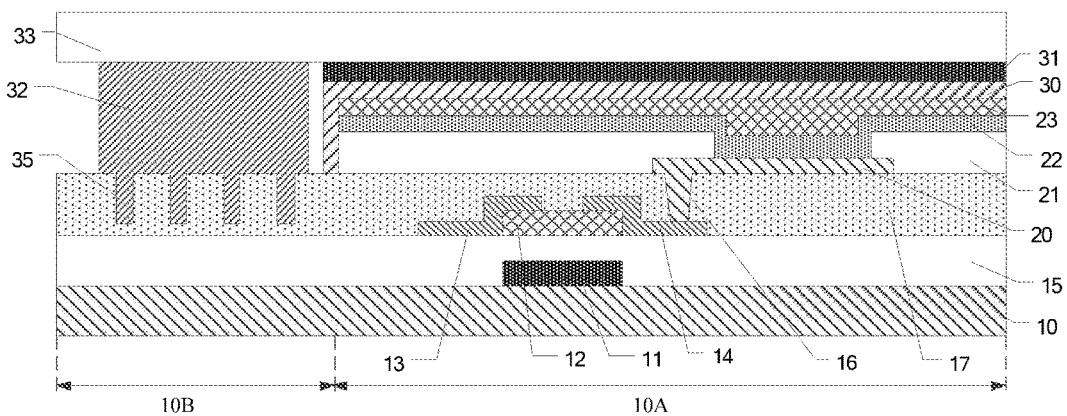
FIG. 2a is a partial sectional schematic diagram of an organic light emitting diode (OLED) display panel in an embodiment of the present disclosure.
Figure 2B:
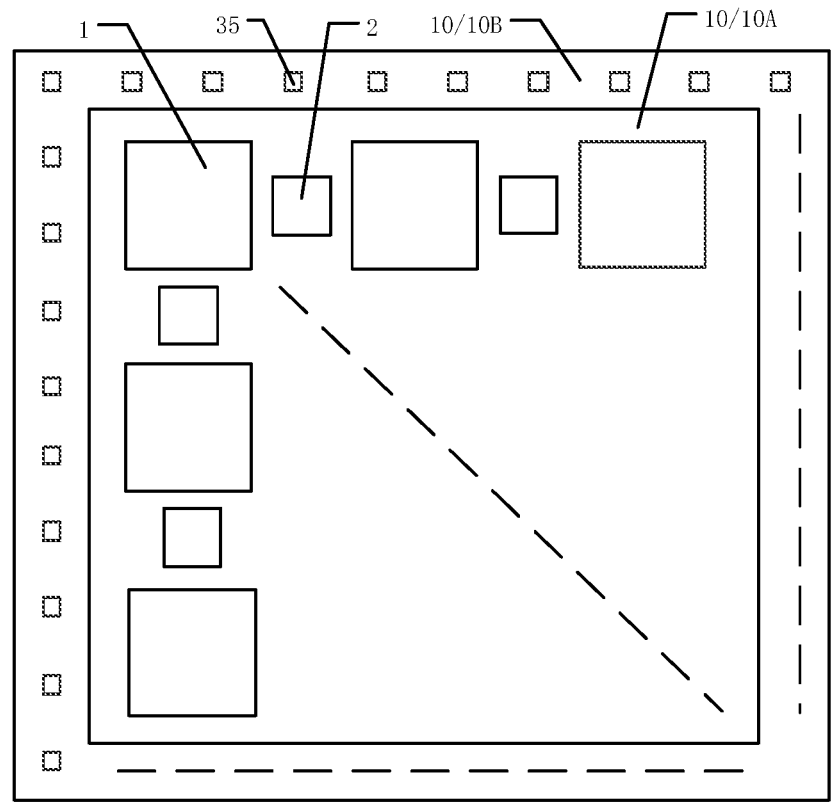
FIG. 2b is a plan schematic diagram of an organic light emitting diode (OLED) display panel in an embodiment of the present disclosure.
Figure 2C:
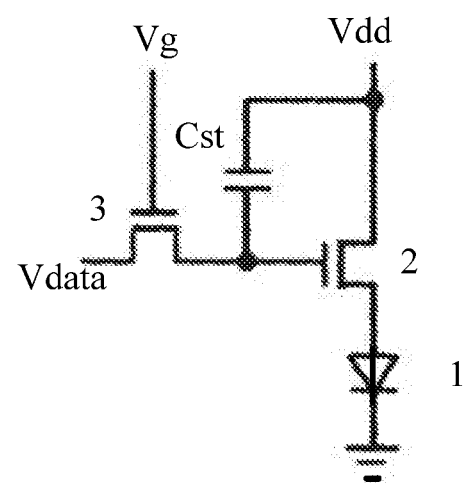
FIG. 2c is a schematic diagram of a driving circuit of an organic light emitting diode (OLED) display unit in an embodiment of the present disclosure.
Figure 4:
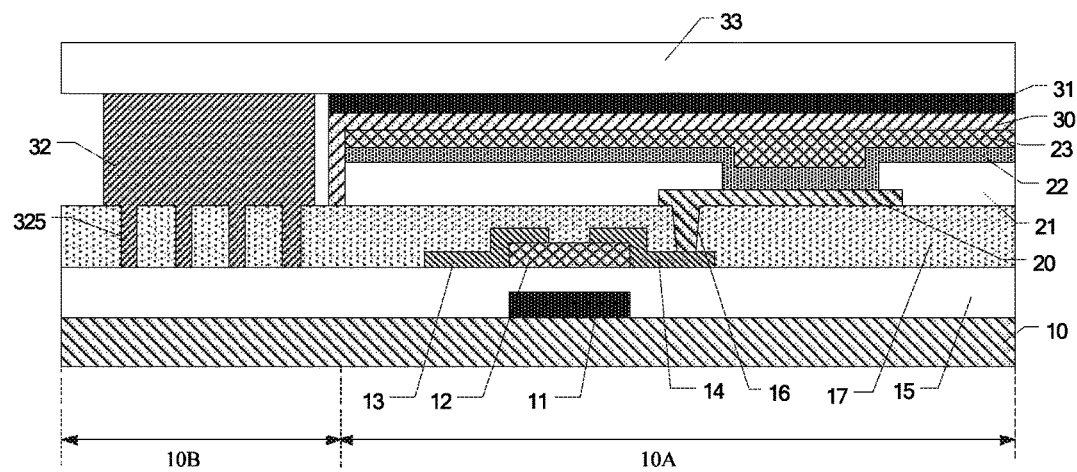
FIG. 4 is a partial sectional schematic diagram of an organic light emitting diode (OLED) display panel in another embodiment of the present disclosure.
Figure 5:
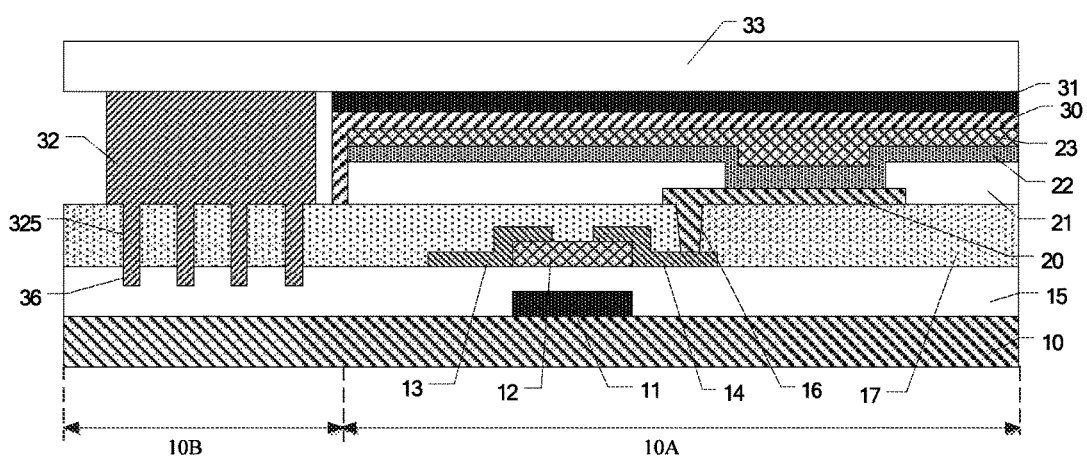
FIG. 5 is a partial sectional schematic diagram of an organic light emitting diode (OLED) display panel in further another embodiment of the present disclosure.

FIG. 2a illustrates a partial sectional schematic diagram of an organic light emitting diode (OLED) display panel in an embodiment of the present disclosure; FIG. 2b illustrates a plan schematic diagram of an organic light emitting diode (OLED) display panel in an embodiment of the present disclosure; FIG. 2c illustrates a schematic diagram of a driving circuit of an organic light emitting diode (OLED) display unit in an embodiment of the present disclosure; FIGS. 3a-3i illustrate the views of a manufacture method of an organic light emitting diode (OLED) display panel in an embodiment of the present disclosure; FIG. 4 illustrates a partial sectional schematic diagram of an organic light emitting diode (OLED) display panel in another embodiment of the present disclosure; FIG. 5 illustrates a partial sectional schematic diagram of an organic light emitting diode (OLED) display panel in further another embodiment of the present disclosure. It should be noted that FIGS. 2a, 2b, 2c, 3a-3i, 4 and 5 only illustrate part of the relevant structure of the OLED display panel for the purpose of clarity.

As illustrated in FIGS. 2a and 2b, the OLED display panel of the embodiment of the present disclosure comprises: a base substrate 10 and a driving transistor 2, a passivation layer 17 and an OLED display unit 1 that are arranged on the base substrate 10, a package substrate 33, and a sealant 32 that is arranged between the base substrate 10 and the package substrate 33. The passivation layer 17 comprises a plurality of first recesses 35 and a via hole 16 exposing the driving transistor 2, the plurality of first recesses 35 and the via hole 16 are formed on the passivation layer 17 by the same patterning process, and the number of masks in preparation can be reduced, the production time of OLED display panels can be shortened, the production costs of OLED display panels can be reduced, and the production capacity and the product yield can be increased effectively. The sealant 32 is formed on the passivation layer 17 and covers the plurality of first recesses 35. The plurality of first recesses 35 can increase the contact area between the sealant 32 and the passivation layer 17, and therefore increase the adhesiveness between the sealant 32 and the interface of the passivation layer 17, improve the packaging effect of the OLED display panel, reduce the oxygen and water vapor that penetrate into the OLED display panel, improve the display performance and device stability of the OLED display panel, and prolong the service life of the OLED display panel.

For example, a longitudinal cross-sectional shape of each first recess 35 can be a rectangular, a trapezoidal or the like. The plurality of first recesses 35 can be spaced apart from each other. As illustrated in FIG. 2a, the number of the plurality of first recesses 35 can be, for example, four. The embodiment of the present disclosure is not limited to these specific arrangements.

For example, in a direction that is perpendicular to the base substrate 10, the first recesses 35 and the via hole 16 can have the same depth; alternatively, the first recesses 35 and the via hole 16 can also have different depths. For example, as illustrated in FIG. 4. the first recesses 35 can be through holes 325 penetrating the passivation layer 17. The through holes 325 can further increase the contact area between the sealant 32 and the passivation layer 17, increase the adhesiveness between the sealant 32 and the interface of the passivation layer 17, and improve the packaging effect of the OLED display panel.

For example, as illustrated in FIG. 2b, the base substrate 10 comprises a display area 10A and a package area 10B that is located at a periphery of the display area 10A. The display area 10A can also be called as an AA (Active Area) area. The display area 10A can comprise pixel units that are arranged in an array to realize display, and a sealant or the like can be provided in the package area 10B to realize the package of the display panel.

For example, the passivation layer 17 can be arranged in both the display area 10A and the package area 10B, the plurality of first recesses 35 are arranged in the package area 10B, and the via hole 16 is arranged in the display area 10A.

For example, the OLED display unit 1 can be arranged in the display area 10A. As illustrated in FIG. 2a, the OLED display unit 1 comprises a first electrode 20, a pixel definition layer 21, an organic layer 22 and a second electrode 23. The organic layer 22 is sandwiched between the first electrode 20 and the second electrode 23. The organic layer 22 can be in a multi-layer structure. For example, the organic layer 22 can comprise a multi-layer structure formed by a hole injection layer, a hole transport layer, a light emitting layer, an electron transport layer and an electron injection layer. The organic layer 22 can further comprise a hole blocking layer and an electron blocking layer. The hole blocking layer, for example, can be arranged between the electron transport layer and the light emitting layer, and the electron blocking layer, for example, can be arranged between the hole transport layer and the light emitting layer. The arrangement and the material of each layer in the organic layer 22 can refer to a common design, and the embodiment of the present disclosure is not limited in this aspect.

For example, the pixel definition layer 21 is configured to define a sub-pixel area, and the light emitting layer in the organic layer 22 is correspondingly arranged in an opening area of the pixel definition layer 21. The pixel definition layer 21 can be in a one-layer or two-layer structure, and can also be in a multi-layer composite layer structure. For example, the pixel definition layer 21 can comprise a first definition layer and a second definition layer. The first definition layer and the second defining layer can be made of organic materials in different characteristics of hydrophilicity. For example, the first definition layer can be made of a hydrophilic organic material, and the second definition layer, for example, can be made of a hydrophobic organic material, but the embodiment of the present disclosure is not limited thereto. For example, when the light emitting material in the organic layer 22 is a hydrophilic material, the first definition layer is closer to the organic layer 22, the second definition layer is closer to the first electrode 20, the first definition layer that is formed by the hydrophilic material can flatten droplets of the light emitting material, allowing the droplets of the light emitting material to smoothly spread out over the opening area of the pixel defining layer 21, and therefore the light emitting quality of the OLED display panel can be improved.

For example, the OLED display unit 1 can adopt the means of active driving or passive driving. The passive driving OLED display panel comprises a cathode and an anode, and the intersection portion between the anode and the cathode can emit light. The driving circuit can be amounted externally by a connection means of a tape carrier package (TCP), a chip on glass (COG) and so on. The active driving OLED display panel can be equipped with a thin film transistor with a switching function and a charge storage capacitor for each pixel, and the peripheral drive circuit and the entire system of the OLED display unit 1 can be integrated on a same glass substrate. As illustrated in FIG. 2a, in one example, the OLED display unit 1 adopts an active driving mode, so that the driving circuit comprises a driving transistor 2. The driving transistor 2 is arranged in the display area 10A, and the driving transistor 2 can serve as a driving component of the OLED display unit 1 to connect the OLED display unit 1 to a power source.

For example, the driving transistor 2 can comprise a gate electrode 11, a gate insulating layer 15, an active layer 12, a third electrode 13, and a fourth electrode 14. The via hole 16 exposes the fourth electrode 14, and the first electrode 20 is electrically connected with the fourth electrode 14 through the via hole 16. For example, the third electrode 13 can be a source electrode or a drain electrode, and the fourth electrode 14 is a drain electrode or a source electrode, correspondingly.

For example, as illustrated in FIG. 5, the gate insulating layer 15 of the driving transistor 2 can also extend into the package area 10B, and the through holes 325 that penetrate the passivation layer 17 expose the gate insulating layer 15. For example, the gate insulating layer 15 can further comprise second recesses 36 corresponding to the through holes 325. The second recesses 36 allow the sealant 32 to contact the gate insulating layer 15, thus further increasing the depth(s) of the sealant 32 in a direction that is perpendicular to the base substrate 10, prolonging the channel length for the outside air, moisture and so on to penetrate into the OLED display panel, effectively blocking the air, moisture and so on to penetrate into the OLED display panel, improving the display performance and device stability of the OLED display panel, and prolonging the service life of the OLED display panel.

For example, as illustrated in FIG. 2c, in addition to the driving transistor 2, the driving circuit can further comprise a switching transistor 3 and a storage capacitor Cst, that is, the driving circuit can adopt, for example, a 2T1C structure. A gate electrode of the switching transistor 3 is connected to a gate line Vg, an input terminal (for example, a source electrode or a drain electrode) of the switching transistor 3 is electrically connected to a data line Vdata, and an output terminal (correspondingly, for example, the drain electrode or the source electrode) is electrically connected to the gate electrode 11 of the transistor 2. A terminal of the storage capacitor Cst is connected to the third electrode 13 of the driving transistor 2, and the other terminal is connected to, for example, the output terminal (for example, the drain electrode or the source electrode) of the switching transistor 3. The third electrode 13 of the driving transistor 2 can be connected to, for example, a power line Vdd, the fourth electrode 14 can be electrically connected to the first electrode 20 of the OLED display unit 1, and the second electrode 23 of the OLED display unit 1 can be grounded, for example. When an ON signal (turning-on signal) is applied to the gate line Vg, the switching transistor 3 is turned on, the voltage over the data line Vdata charges the storage capacitor Cst through the switching transistor 3, and the voltage of the storage capacitor Cst controls the gate voltage of the driving transistor 2. When the OFF signal (turning-off signal) is applied to the gate line Vg, the switching transistor 3 is turned off, the charges stored in the storage capacitor Cst continue to maintain the gate voltage of the driving transistor 2, and the driving transistor 2 is kept in the conductive state, and therefore in the entire frame cycle, the OLED display unit 1 is in working state.

It should be noted that in the embodiment of the present disclosure, the driving circuit can also be an optional structure such as a 3T1C structure, a 4T2C structure or the like. For example, the driving circuit can further comprise a detection transistor, a compensation transistor, a reset transistor and so on, and the embodiments of the present disclosure do not limit the specific structure of the driving circuit.

For example, as illustrated in FIG. 2a, the OLED display panel of the embodiment can further comprise a package layer 30 that is arranged on the OLED display unit 1 and a filling layer 31 that is arranged on the package layer 30. The package substrate 33 is arranged on the sealant 32 and the filling layer 31, and the package substrate 33 and the base substrate 10 are assembled and sealed oppositely. It should be noted that the sealant 32 and the filling layer 31 are formed of different materials, and the sealant 32 and the filling layer 31 can be arranged separately, so that no contact occurs between the sealant 32 and the filling layer 31, thus chemical and/or physical reaction between the sealant 32 and the filling layer 31 can be avoided, and the sealing performance of the OLED display panel can be further ensured.

For example, as illustrated in FIG. 2b, a plurality of OLED display units 1 and drive transistors 2 are arranged in the display area 10A of the base substrate 10, and the plurality of OLED display units 1 can be arranged in an array comprising m rows and n columns (m, n are integers). A plurality of first recesses 35 are arranged in the packaging area 10B, and the first recesses 35 are not limited to the arrangement of a single row and a single column in FIG. 2b. For example, the first recesses 35 can be arranged in a plurality of rows and a plurality of columns, and the number of the first recesses 35 can be determined according to the area of the package area 10B.

For example, the OLED display panel provided by an embodiment of the present disclosure can realize color display by using the red, green and blue pixels independently emitting light; the OLED display panel provided by an embodiment of the present disclosure can also use the OLED display unit to emit white light and then incorporate color filters to realize color display; the OLED display panel provided by an embodiment of the present disclosure can also use the OLED display unit to emit blue light, and then use the blue light to activate light color conversion materials to obtain red light and green light so as to realize color display. Persons of ordinary skill in the art should understand that the light emitting methods of the OLED display panel of the embodiments of the present disclosure are not limited to the above three methods, and are not limited to the specific color of the light emitted by the OLED display panel.

The manufacture method of the OLED display panel of the above embodiment will be described below with reference to FIGS. 3a to 3i.

Figure 3A:
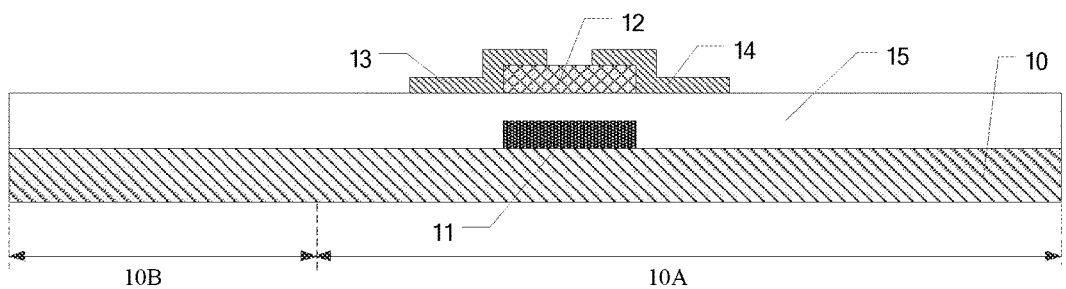
FIGS. 3a-3i are views of a manufacture method of an organic light emitting diode (OLED) display panel in an embodiment of the present disclosure.

As illustrated in FIG. 3a, a base substrate 10 is provided. A gate electrode 11, a gate insulating layer 15, an active layer 12, a third electrode 13, and a fourth electrode 14 are formed on the base substrate 10 to form a drive transistor 2 and so on by a deposition process and a patterning process.

For example, the base substrate 10 can be a transparent insulating substrate, and the examples of the material for the base substrate 10 can comprise glass substrate, quartz substrate or other suitable material.

For example, the materials for the third electrode 13, the fourth electrode 14 and the gate electrode 11 can comprise copper-based metal, aluminum-based metal, nickel-based metal, and so on. The copper-based metal has characteristics of low resistivity and good conductivity, so that the signal transmission rate of the third electrode 13 and the fourth electrode 14 can be improved.

For example, the material for the active layer 12 can comprise amorphous silicon, polysilicon, oxide semiconductor or other suitable material. The polysilicon can be high-temperature polysilicon or low-temperature polysilicon. The oxide semiconductor can be, for example, indium gallium zinc oxide (IGZO), indium zinc oxide (IZO), zinc oxide (ZnO), barium zinc oxide (GZO) and so on.

For example, the examples of the material forming the gate insulating layer 15 comprise silicon nitride (SiNx), silicon oxide (SiOx), silicon oxynitride (SiNxOy) or other suitable material.

Figure 3B:
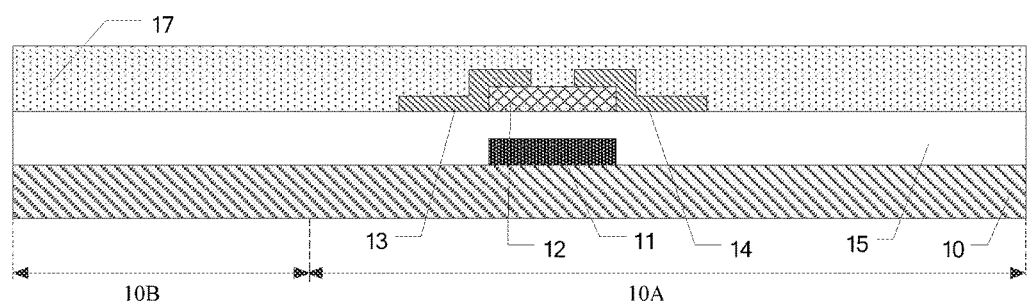

For example, as illustrated in FIG. 3b, a passivation layer 17 is formed by a deposition process on the base substrate 100 on which the drive transistor 2 is formed.

For example, the examples of the material for the passivation layer 17 comprise silicon nitride (SiNx), silicon oxide (SiOx), silicon oxynitride (SiNxOy) or other suitable material.

Figure 3C:
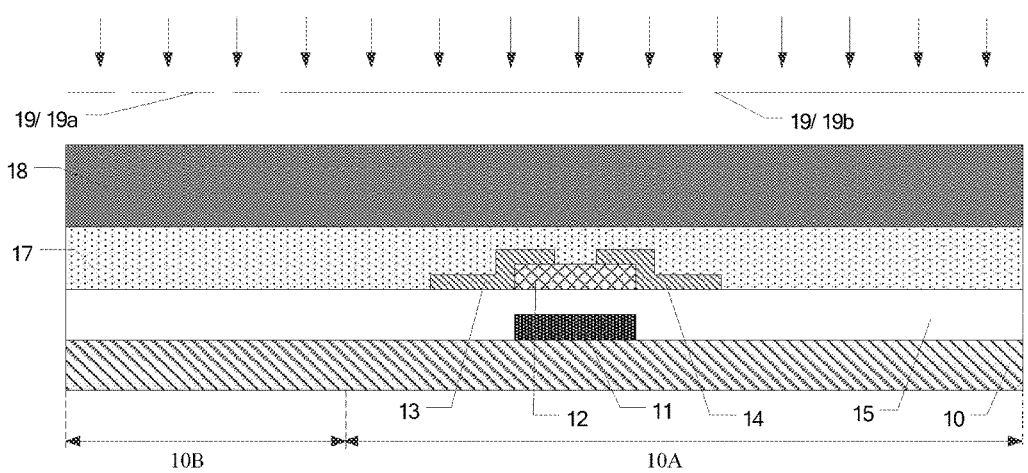
Figure 3D:
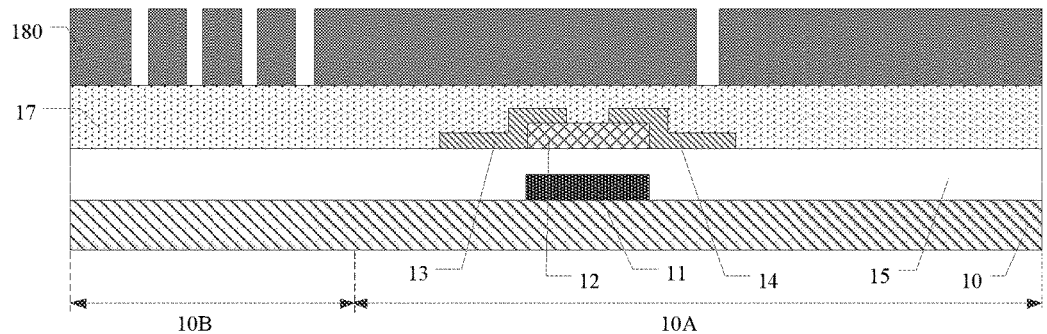

For example, as illustrated in FIGS. 3c and 3d, a layer of photoresist 18 is formed on the passivation layer 17, the photoresist 18 is exposed by a mask 19, and then the exposed photoresist 18 is developed to obtain a photoresist pattern 180.

Figure 3E:
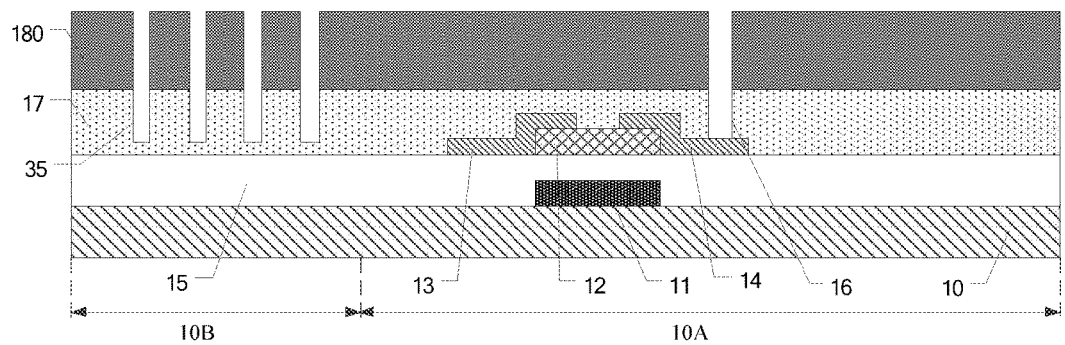
Figure 3F:
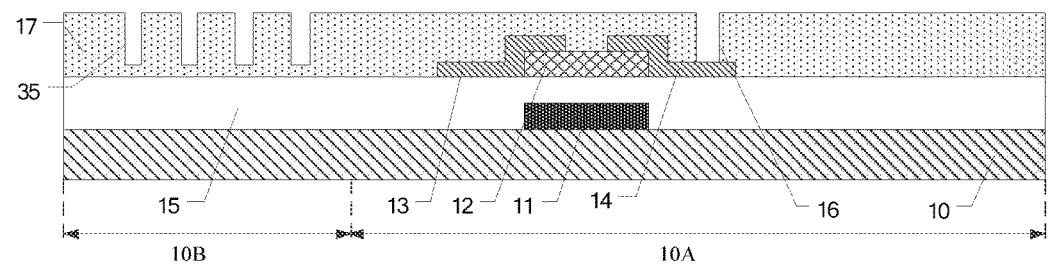

For example, as illustrated in FIGS. 3e and 3f, the passivation layer 17 is etched using the photoresist pattern 180 as a mask; finally, the remaining photoresist pattern 180 is stripped off to form a plurality of first recesses 35 and a via hole 16 exposing a portion of the fourth electrode 14.

For example, as illustrated in FIG. 3c, the mask 19 comprises first patterns 19a corresponding to the first recesses 35 and a second pattern 19b corresponding to the via hole 16. Therefore, the first recesses 35 and the via 16 can be formed through one patterning process, thus reducing the number of masks, shortening the production time of the OLED display panel, reducing the production cost of the OLED display panel, and effectively increasing the production capacity and product yield.

For example, as illustrated in FIG. 4, during the etching process, the etching time can be adjusted to allow the first recesses 35 to penetrate the passivation layer 17 and therefore form through holes 325. For example, as illustrated in FIG. 5, during forming of the driving transistor 2, a gate insulating layer 15 is formed in both the display region 10A and the package region 10B, and during forming the through holes 325 in the passivation layer 17, an etchant that can selectively etch a metal and the material of the gate insulating layer 15 can be used. When the via hole 16 is formed to expose the fourth electrode 14, the etching process is stopped, but when the first recesses 35 penetrating the passivation layer 17 is formed to expose the gate insulating layer 15, the etching process is continued, so that the gate insulating layer 15 is at least partially etched, and second recesses 36 are formed on the gate insulating layer 15.

Figure 3G:
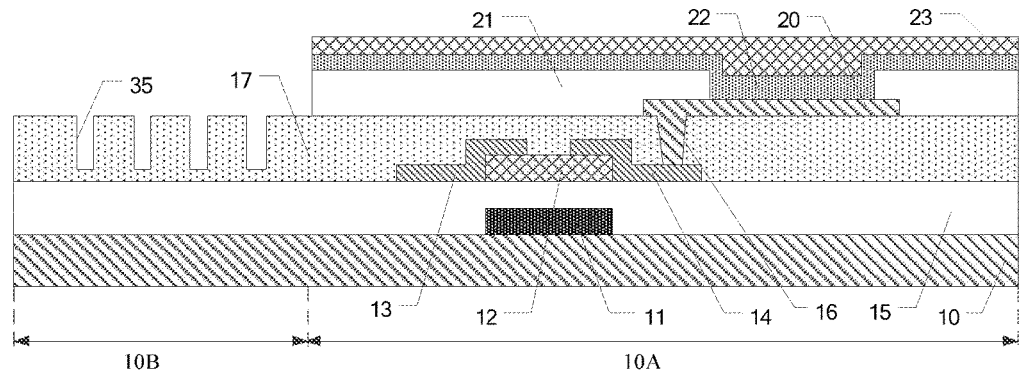

For example, as illustrated in FIG. 3g, a first electrode 20, a pixel definition layer 21, an organic layer 22 and a second electrode 23 are formed on the passivation layer 17 to constitute an OLED display unit 1 by a deposition process and a patterning process. The first electrode 20 is electrically connected to the fourth electrode 14 through the via hole 16.

For example, one of the first electrode 20 and the second electrode 23 is an anode and the other is a cathode. The first electrode 20 can be formed of, for example, a transparent conductive material with a high work function. The electrode material can comprise indium tin oxide (ITO), indium zinc oxide (IZO), indium gallium oxide (IGO), zinc oxide zinc oxide (GZO), zinc oxide (ZnO), indium oxide ($In_2O_3$), aluminum zinc oxide (AZO), carbon nanotubes and so on; the second electrode 23 can be formed of, for example, a material with high conductivity and a low work function, and the electrode material can comprise magnesium aluminum alloy (MgAl), lithium aluminum alloy (LiAl), and other alloys, or magnesium, aluminum, lithium, and other single metals.

For example, the organic layer 22 can comprise a light emitting layer, and a material of the light emitting layer can be selected according to the color of the light emitted by the light emitting layer. The material of the light emitting layer comprises a fluorescent light emitting material or a phosphorescent light emitting material. At present, a doping system is generally adopted, that is, a dopant material is mixed in a main light emitting material to obtain a usable light emitting material. For example, the main light emitting material can adopt a metal compound material, a ruthenium derivative, an aromatic diamine compound, a triphenylamine compound, an aromatic triamine compound, a biphenyldiamine derivative, a triarylamine polymer and so on.

Figure 3H:
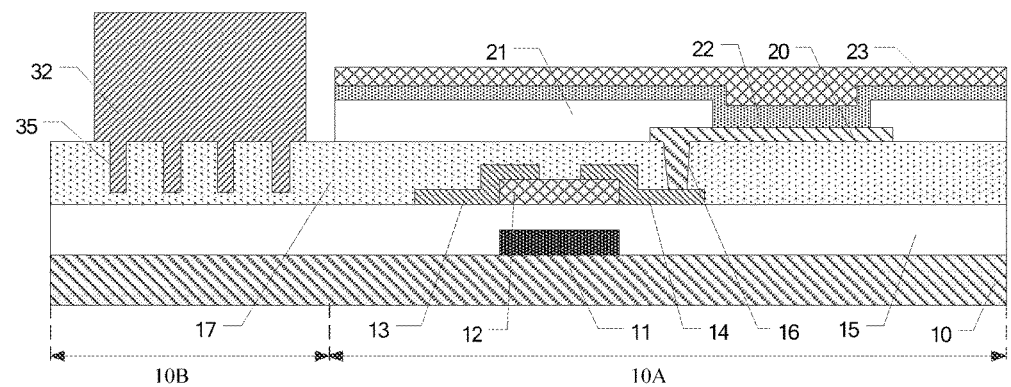

For example, as illustrated in FIG. 3h, a sealant 32 is formed on the passivation layer 17 at a position corresponding to the first recesses 35 by a coating process and so on, and the sealant 32 covers the first recesses 35, so that at least a portion of the sealant 32 can move into the first recesses 35. The first recesses 35 can increase the contact area between the sealant 32 and the passivation layer 17, thus increase the adhesiveness between the sealant 32 and the interface of the passivation layer 17, and improve the packaging effect of the OLED display panel, reduce the oxygen and water vapor that penetrate into the OLED, improve the display performance and device stability of the OLED display panel, and prolong the service life of the OLED display panel.

For example, in the examples illustrated in FIGS. 4 and 5, the through holes 325 can further increase the contact area between the sealant 32 and the interface of the passivation layer 17 and improve the packaging effect of the OLED display panel. On the other hand, the through holes 325 and the second recesses 36 can further increase the depth of the sealant 32 in a direction that is perpendicular to the base substrate 10, prolong the channel length for the outside air, moisture and so on to penetrate into the OLED display panel, effectively block the air, moisture and so on to penetrate into the OLED display panel, improve the display performance and device stability of the OLED display panel, and prolong the service life of the OLED display panel.

For example, the material of the sealant 32 can be an organic material, an inorganic material, or a combination of an organic material and an inorganic material. The organic material can comprise epoxy resin, polyurethane, organic silica gel, acrylate, polysiloxane, polyamide, polyester or a combination thereof, and the inorganic material can comprise water glass and so on.

Figure 3I:
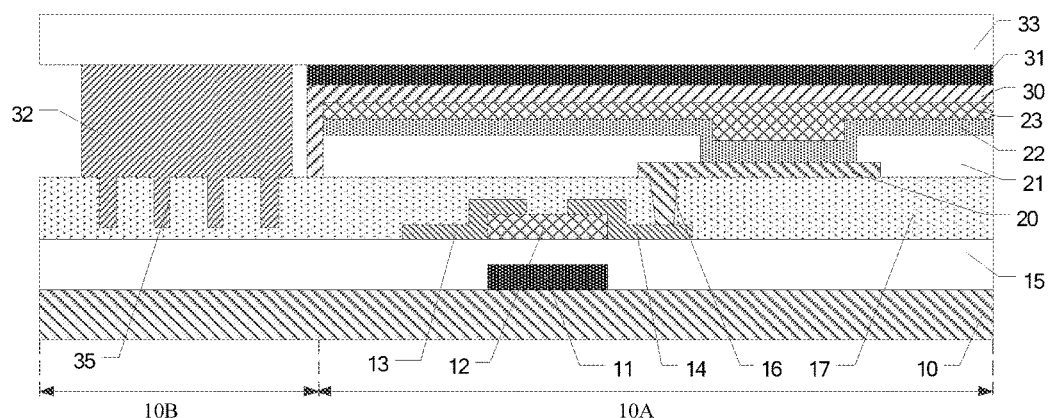

For example, as illustrated in FIG. 3i, the package layer 30 and the filling layer 31 are formed on the OLED display unit 1 by a deposition process; then the package substrate 33 is arranged on the sealant 32 and the filling layer 31, so that the package substrate 33 and the base substrate 10 are assembled oppositely, finally the sealant 32 is cured by irradiation with ultraviolet light or a heat curing process or the like, and therefore the package of the package substrate 33 and the base substrate 10 is completed.

For example, the material of the filling layer 31 can comprise a desiccant to block water vapor and so on from penetrating into the OLED display panel. For example, the material of the filling layer 31 can be a polymer material containing a desiccant; it can also be a moisture-blocking polymer material and so on, such as a polymer resin, etc.; it can also be a water-absorbing material, such as an alkali metal (for example, Li, Na), an alkaline earth metal (for example, Ba, Ca) or other moisture reactive metals (for example, Al, Fe); it can also be an alkali metal oxide (for example, $Li_2O$, $Na_2O$), an alkaline earth metal oxide (for example, MgO, CaO, BaO), a sulfate material (for example, anhydrous $MgSO_4$), a metal halide material (for example, $CaCl_2$), a perchlorate material (for example, $Mg(ClO_4)_2$) and so on.

For example, the material of the package layer 30 can be silicon nitride (SiNx), silicon oxide (SiOx), silicon oxynitride (SiNxOy) or other suitable materials.

For example, the sealant 32 can also be cured by pressing, melting, cooling, reaction curing, or a combination thereof. Typical materials that can be cured by pressing comprise pressure sensitive adhesives. Typical materials that can be cured by melting and cooling comprise hot melt adhesives such as polyolefins, polyesters, polyamides and so on. Typical materials that can be cured by reaction curing comprise acrylates, epoxies, urethanes, polysiloxanes or a combination thereof, and the reactive curing comprises, for example, heat curing, ultraviolet radiation curing and so on.

It should be noted that the material of each of the above layers are schematically illustrated, and the embodiments of the present disclosure do not limit the material of each of the layers.

It should be noted that the driving transistor 2 can be a thin film transistor in a bottom gate structure, or a thin film transistor in a top gate structure. For example, in the embodiments illustrated in the drawings of the present disclosure, the driving transistor 2 is a thin film transistor in a bottom gate structure. The OLED display unit 1 can adopt a bottom emission or top emission mode, and can also adopt a two-side emission mode. For example, when the OLED display unit 1 adopts the bottom emission mode, the anode of the OLED display unit 1 can be a transparent electrode such as an indium tin oxide electrode, and the cathode of the OLED display unit 1 can be an opaque metal. When the OLED display unit 1 adopts the top emission mode, the anode of the OLED display unit 1 can be a reflective electrode, and the cathode can adopt a semitransparent electrode. The embodiments of the present disclosure are not limited in this aspect.

Figure 6:
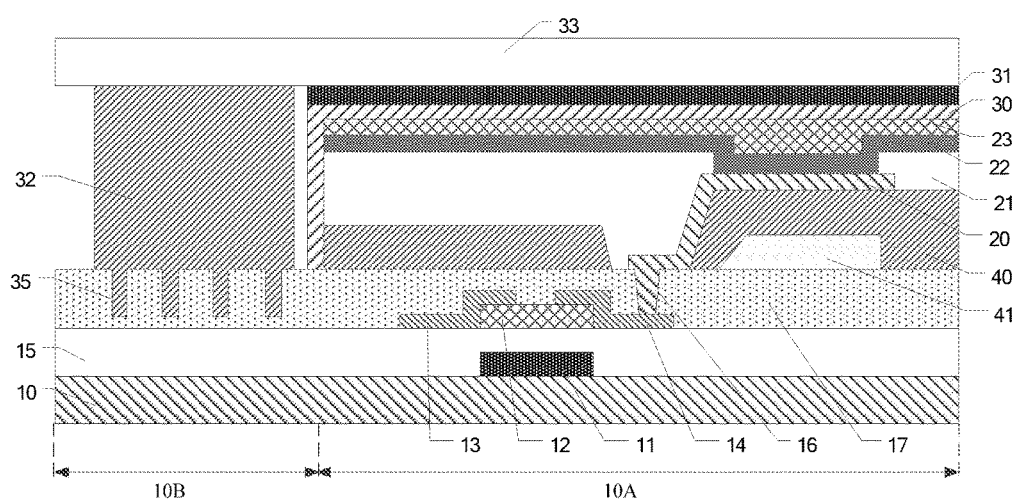
FIG. 6 is a partial sectional schematic diagram of an organic light emitting diode (OLED) display panel in still further an embodiment of the present disclosure.

An embodiment of the present disclosure also provides an organic light emitting diode (OLED) display panel. FIG. 6 is a partial sectional schematic diagram of an organic light emitting diode (OLED) display panel in an embodiment of the present disclosure. As illustrated in FIG. 6, the OLED display panel provided by the embodiment of the present disclosure adopts the bottom emission mode.

For example, the OLED display panel provided by the embodiment of the present disclosure can use the OLED display unit to emit white light, and then realize the color display by a method of incorporating a color filter. As illustrated in FIG. 6, the OLED display panel of the embodiment of the present disclosure comprises: a base substrate 10, a driving transistor 2, a passivation layer 17, a color filter film 41, a planarization layer 40, an OLED display unit 1, a package layer 30, a filling layer 31, a package substrate 33 and a sealant 32. The passivation layer 17 is arranged in both the display area 10A and the package area 10B. The via hole 16 and the first recesses 35 are formed by one patterning process, so that the number of masks can be reduced, the production time of the OLED display panel can be shortened, the production cost of the OLED display panel can be reduced and the product yield can be effectively improved; the first recesses 35 are formed in the package area 10B, and the sealant 32 is coated in the package area 10B and covers the first recesses 35. The first recesses 35 can increase the contact area of the sealant 32 and the passivation layer 17, increase the adhesiveness between the sealant 32 and the passivation layer 17, and improve the packaging effect of the OLED display panel.

For example, in a direction that is perpendicular to the base substrate 10, the color filter film 41 overlaps the opening area defined by the pixel definition layer 21 in the OLED display unit 1, so that the light emitted from the organic layer 22 can filter through the color filter film 41 to achieve color display. For example, the color filter film 41 can comprise three primary color filter films, they can be a red filter film, a blue filter film or a green filter film corresponding to the display unit illustrated in the schematic diagram of FIG. 6. For example, the organic layer 22 can emit white light, then the white light filters through the color filter film 41 to obtain light of three primary colors, and the light of three primary colors are combined to realize color display.

It should be noted that each pixel definition area of the pixel definition layer 21 corresponds to a pixel electrode, and each sub-pixel definition area of the pixel definition area corresponds to a single color sub-pixel definition area. As illustrated in FIG. 6, the color filter film 41 can be a single color filter film. For example, a plurality of sub-pixel definition areas form a pixel definition area, and the color filter films 41 of the plurality of sub-pixel definition areas can respectively correspond to a red filter film, a blue filter film, a green filter film and so on, so that color display can be realized.

For example, the material for the planarization layer 40 can be an organic material, comprising, for example, epoxy, polyimide, polyamide, acrylic or other suitable materials.

The structures and preparation materials of the other layers of the OLED display panel of the embodiments of the present disclosure can be the same as those in the embodiments of the manufacture method of an OLED display panel described above, and will not be described again.

For example, in the manufacture method of the OLED display panel provided by the embodiment of the present disclosure, the steps before forming the passivation layer 17 can be the same as the corresponding steps in the embodiment of the manufacture method of the OLED display panel described above. For example, after the passivation layer 17 is formed, a color filter film 41 is formed on the passivation layer 17, a planarization layer 40 is then formed on the color filter film 41, and after the planarization layer 40 is formed, first recesses 35 and a via hole 16 exposing a portion of the fourth electrode 14 are formed by one patterning process. For example, in one example, the color filter film 41 and the planarization layer 40 can be formed first, and then the first recesses 35 and the via hole 16 can be formed on the passivation layer 17, so that during the process of forming the color filter film 41 and planarization layer 40, the second electrode 14 that is exposed by the via hole 16 can be prevented from reacting with the oxygen and so on in the air to form a metal oxide layer, resulting in poor electrical contact between the second electrode 14 and the first electrode 20, and affecting the display performance of the OLED display panel. The steps after forming the first recesses 35 and the via hole 16 can also be the same as the embodiments of the manufacture method of the OLED display panel described above, and will not be described again.

For example, the color filter film 41 can be formed by a method such as a dyeing method, a pigment dispersion method, a reverse printing method, a thermal multilayer technique or an inkjet printing method.

An embodiment of the present disclosure further provides a display device, the display device comprises the organic light emitting diode (OLED) display panel in any of the above embodiments, and the display device can further comprise a gate driving circuit, a data driving circuit, a power supply and so on. The display device can be any product or component that has a display function, such as a television, a digital camera, a mobile phone, a watch, a tablet computer, a notebook computer or a navigator.

It should be noted that, in order to illustrate clearly, the entire structure of the display device is not described. In order to realize necessary functions of the display device, a person skilled in the art can arrange other structures according to a specific application situation, the present disclosure is not limited in this aspect.

It should be noted that, the display area 10A and the package area 10B in the OLED display panel are all divided according to the corresponding areas on the OLED display panel, and physical boundary or boundaries of these areas may not exist on the base substrate 10 of the OLED display panel.

The embodiments of the present disclosure provide an organic light emitting diode (OLED) display panel, a manufacture method of an OLED display panel and a display device. The via hole and the plurality of recesses on the passivation layer can be formed by same one patterning process, which can reduce the number of masks, shorten the production time of the OLED display panel, and reduce the production cost of the OLED display panel; on the other hand, the plurality of recesses can increase the contact area of the sealant and the passivation layer, and therefore increase the adhesiveness between the sealant and the interface of the passivation layer, improve the packaging effect of the OLED display panel, and effectively reduce the oxygen and water vapor that penetrate into the OLED display panel, improve the display performance and stability of the OLED display panel, prolong the service life of the OLED display panel, and improve the product yield.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a area may be enlarged or reduced, that is, these drawings are not drawn according to actual scale.

(3) In case of no conflict, features in one embodiment or in different embodiments can be combined to obtain a new embodiment.

What are described above is only the specific embodiments of the disclosure and not limitative to the scope of the disclosure; the scopes of the disclosure are defined by the accompanying claims.

What is claimed is:

1. A manufacture method of an organic light emitting diode (OLED) display panel, comprising:
    providing a base substrate, the base substrate comprising a display area and a package area that is located at a periphery of the display area;
    forming a driving transistor, a passivation layer and an OLED display unit on the base substrate, wherein the OLED display unit and the driving transistor are formed in the display area, the passivation layer is formed in both the display area and the package area, the passivation layer comprises a plurality of recesses that are formed in the package area and a via hole that is formed in the display area to expose a source electrode or a drain electrode of the driving transistor, the via hole and the plurality of recesses are formed by same one patterning process, and the recesses are through holes that penetrate the passivation layer;
    forming a gate insulating layer in both the display area and the package area during forming the driving transistor, and partially etching the gate insulating layer to form non-through holes, with the through holes exposing the gate insulating layer, during forming the through holes in the passivation layer;
    coating a sealant in the package area, wherein the sealant covers the plurality of recesses; and
    providing a package substrate, wherein the package substrate and the base substrate are assembled together and sealed oppositely by the sealant.

2. The manufacture method of an OLED display panel according to claim 1, further comprising:
    forming a package layer on the OLED display unit; and
    forming a filling layer on the package layer;
    wherein the package substrate is arranged on the sealant and the filling layer to allow the package substrate and the base substrate to be assembled together and sealed oppositely.

3. The manufacture method of an OLED display panel according to claim 2, wherein a material of the filling layer comprises a desiccant.

4. The manufacture method of an OLED display panel according to claim 1, wherein a longitudinal cross-sectional shape of each of the recesses is a rectangular or a trapezoidal.

5. The manufacture method of an OLED display panel according to claim 1, wherein an anode or a cathode of the OLED display unit is electrically connected with the source electrode or the drain electrode of the driving transistor through the via hole during forming the OLED display unit.

6. An organic light emitting diode (OLED) display panel, comprising:
    a base substrate, comprising a display area and a package area that is located at a periphery of the display area;
    a driving transistor, a passivation layer and an OLED display unit that are arranged on the base substrate, wherein the OLED display unit and the driving transistor are in the display area, the passivation layer is in both the display area and the package area, the passivation layer comprises a plurality of first recesses in the package area and a via hole in the display area that exposes a source electrode or a drain electrode of the driving transistor, the plurality of first recesses and the via hole are formed by same one patterning process and the OLED display unit is electrically connected with the driving transistor through the via hole;
    a sealant that is in the package area and covers the plurality of first recesses; and
    a package substrate that is assembled and sealed oppositely with the base substrate,
    wherein the first, recesses are through holes that penetrate the passivation layer, and
    a gate insulating layer of the driving transistor also extends to the package area and is exposed by the through holes, and the gate insulating layer further comprises second recesses corresponding to the through, holes, and the second recesses are non-through holes.

7. The OLED display panel according to claim 6, further comprising:
    a package layer that is on the OLED display unit; and
    a filling layer that is on the package layer;
    wherein the package substrate is on the sealant and the filling layer, and the package substrate and the base substrate are assembled together and sealed oppositely.

8. The OLED display panel according to claim 7, wherein a material of the filling layer comprises a desiccant.

9. The OLED display panel according to claim 6, wherein a longitudinal cross-sectional shape of each of the recesses is a rectangular or a trapezoidal.

10. The OLED display panel according to claim 6, wherein an anode or a cathode of the OLED display unit is electrically connected with the source electrode or the drain electrode of the driving transistor through the via hole.

11. A display device, comprising the OLED display panel according to claim 6.

12. The OLED display panel according to claim 7, wherein the recesses are through holes that penetrate the passivation layer.

13. The OLED display panel according to claim 12, wherein a gate insulating layer of the driving transistor also extends to the package area and is exposed by the through holes, and the gate insulating layer further comprises second recesses corresponding to the through holes.

14. The OLED display panel according to claim 13, wherein an anode or a cathode of the OLED display unit is electrically connected with the source electrode or the drain electrode of the driving transistor through the via hole.

* * * * *